(12) United States Patent
Honeycutt et al.

(10) Patent No.: US 6,734,071 B1
(45) Date of Patent: May 11, 2004

(54) METHODS OF FORMING INSULATIVE MATERIAL AGAINST CONDUCTIVE STRUCTURES

(75) Inventors: Jeffrey W. Honeycutt, Boise, ID (US); Hassan Shahjamali, Boise, ID (US); Daniel Smith, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/651,422

(22) Filed: Aug. 30, 2000

(51) Int. Cl.[7] .............................................. H01L 21/336
(52) U.S. Cl. ..................... 438/301; 438/299; 438/585; 438/587
(58) Field of Search ................................ 438/299, 301, 438/585, 587

(56) References Cited

U.S. PATENT DOCUMENTS

| | | | | |
|---|---|---|---|---|
| 5,424,570 A | * | 6/1995 | Sardella et al. | 257/333 |
| 5,686,337 A | | 11/1997 | Koh et al. | |
| 5,700,349 A | | 12/1997 | Tsukamoto et al. | |
| 5,707,901 A | * | 1/1998 | Cho et al. | 438/595 |
| 5,786,249 A | | 7/1998 | Dennison | |
| 5,915,182 A | * | 6/1999 | Wu | 438/299 |
| 5,918,122 A | * | 6/1999 | Parekh et al. | 438/253 |
| 5,962,897 A | | 10/1999 | Takemura et al. | |
| 6,023,081 A | | 2/2000 | Drowley et al. | |
| 6,107,149 A | * | 8/2000 | Wu et al. | 438/303 |
| 6,150,691 A | * | 11/2000 | Clampitt | 257/308 |
| 6,165,833 A | * | 12/2000 | Parekh et al. | 438/240 |
| 6,232,166 B1 | * | 5/2001 | Ju et al. | 438/231 |
| 6,245,669 B1 | * | 6/2001 | Fu et al. | 438/633 |
| 6,277,720 B1 | * | 8/2001 | Doshi et al. | 438/586 |
| 6,329,252 B1 | * | 12/2001 | Lin | 438/20 |
| 6,420,752 B1 | * | 7/2002 | Ngo et al. | 257/315 |

FOREIGN PATENT DOCUMENTS

JP 11-154755 6/1999

OTHER PUBLICATIONS

Ma et al., "Hydrogen–Free Contact Etch For Ferroelectric Capacitor Formation", U.S. appl. Ser. No. 09/741,650, Filing Date: Dec. 19, 2000, Pub. No. US2002/0006674A1, Pub. Date: Jan. 17, 2002.

* cited by examiner

Primary Examiner—John F. Niebling
Assistant Examiner—Jennifer M. Kennedy
(74) Attorney, Agent, or Firm—Wells St. John P.S.

(57) ABSTRACT

The invention encompasses a method of forming an insulative material along a conductive structure. A conductive structure is provided over a substrate, and an electrically insulative material is formed along at least a portion of the conductive structure. The electrically insulative material comprises at least one of $Si_xO_yN_z$ and $Al_pO_q$, wherein p, q, x, y and z are greater than 0 and less than 10. A dopant barrier layer is formed over the electrically insulative material. BPSG is formed over the dopant barrier layer, and the dopant barrier layer prevents dopant migration from the BPSG to the electrically insulative material. The invention also encompasses transistor structures, and methods of forming transistor structures.

8 Claims, 9 Drawing Sheets

METHODS OF FORMING INSULATIVE MATERIAL AGAINST CONDUCTIVE STRUCTURES

TECHNICAL FIELD

The invention pertains to methods of forming insulative materials against conductive structures, and in particular aspects pertains to methods of forming transistor structures. Also, the invention pertains to transistor structures.

BACKGROUND OF THE INVENTION

A frequently used procedure of semiconductor fabrication is formation of a so-called "self-aligned contact" (SAC) opening. An exemplary use of a SAC opening is to expose a node between a pair of wordlines, and can be conducted as follows. First, a pair of adjacent wordlines are formed over a substrate, and then insulative sidewall spacers are formed along conductive portions of the lines. The wordlines typically comprise conductive portions capped by insulative material. Suitable insulative material for capping the wordlines is silicon nitride. A thick insulative layer (typically borophosphosilicate glass (BPSG)) is formed over the wordlines and insulative sidewall spacers. The insulative sidewall spacers are formed of a material different than the thick insulative layer, with a suitable material being silicon nitride.

An opening is etched through the thick insulative layer and to an electrical node between the wordlines. If the thick insulative layer comprises BPSG and the sidewall spacers comprise silicon nitride, the etch utilizes conditions which are selective for the BPSG relative to the silicon nitride. The insulative spacers are exposed during formation of the opening, but are etched more slowly than the BPSG, and preferably are not entirely removed by the etch of the BPSG. The opening is intended to be formed to have a periphery "aligned" with the spacers, and the formation of the opening is referred to as a "self-aligned a contact" etch.

It is desired that the spacers not be entirely removed during formation of the opening so that the spacers can protect the conductive material of the wordlines from being exposed when the opening is formed. If the conductive material of the wordlines becomes exposed in the openings, device failure will likely result. A problem with current semiconductor fabrication processes is that silicon nitride insulative spacers are occasionally over-etched during formation of contact openings in BPSG, leading to exposure of wordline conductive material, and to device failure.

A possible method for overcoming the above-discussed problem is described in U.S. Pat. No. 5,700,349, which suggests utilizing $Si_xO_yN_z$ or $Al_xO_y$ based materials to protect conductive portions of a wordline during a SAC method. The utilization of $Si_xO_yN_z$ and $Al_xO_y$ as protective materials relative to the conductive material of a wordline during a SAC method shows promise, in that $Si_xO_yN_z$ and $Al_xO_y$ appear to be more resistant to SAC etch conditions than is a silicon nitride protective material. However, the materials of U.S. Pat. No. 5,700,349 have problems associated with their use, and it would be desirable to overcome such problems.

SUMMARY OF THE INVENTION

In one aspect, the invention encompasses a method of forming an insulative material along a conductive structure. A conductive structure is provided over a substrate, and an electrically insulative material is formed along at least a portion of the conductive structure. The electrically insulative material comprises at least one of $Si_xO_yN_z$ and $Al_pO_q$, wherein p, q, x, y and z are greater than 0 and less than 10. A dopant barrier layer is formed over the electrically insulative material. BPSG is formed over the dopant barrier layer, and the dopant barrier layer prevents dopant migration from the BPSG to the electrically insulative material.

In another aspect, the invention encompasses methods of forming transistor structures.

In yet another aspect, the invention encompasses a transistor structure which includes a transistor gate formed over a semiconductive substrate. The transistor gate has a sidewall which comprises electrically conductive material. Source/drain regions are within the substrate and proximate the transistor gate. An electrically insulative material is along the electrically conductive material of the sidewall of the transistor gate. The electrically insulative material comprises at least one of $Si_xO_yN_z$ and $Al_pO_q$, wherein p, q, x, y and z are greater than 0 and less than 10. A layer consisting of silicon dioxide is over the transistor gate, electrically insulative material and substrate. A layer of BPSG is over the layer consisting of silicon dioxide.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In one aspect, the invention is a recognition that deposited antireflective coating (DARC) materials (which are typically $Si_xO_yN_z$, wherein x, y and z are greater than 0 and less than 10) can be utilized to protect conductive materials of wordlines during an etch of BPSG (such as, for example, during a SAC etch).

The invention also encompasses a recognition that if $Si_xO_yN_z$ is utilized to protect a conductive material during an etch, the $Si_xO_yN_z$ is preferably electrically insulative. The $Si_xO_yN_z$ can then function to prevent shorting between the protected conductive material and other conductive materials proximate the protected conductive material.

Further, the invention encompasses a recognition that $Si_xO_yN_z$ can have different characteristics if dopant is provided therein relative to if the material is undoped. Specifically, if dopant permeates within $Si_xO_yN_z$, the material can develop conductive characteristics which will destroy its ability to function as an electrically insulative protective layer. Dopant a can migrate from a doped oxide (such as, for example, BPSG) provided against $Si_xO_yN_z$, and accordingly the invention encompasses provision of a dopant barrier layer between $Si_xO_yN_z$ and a doped oxide provided proximate the $Si_xO_yN_z$.

Dopant migration problems may also occur relative to materials comprising $Al_pO_q$ (wherein p and q are greater than 0 and less than 10), and accordingly the invention also comprises provision of a dopant barrier layer between materials comprising $Al_pO_q$ and doped oxide (such as, for example, BPSG).

Figure 1:
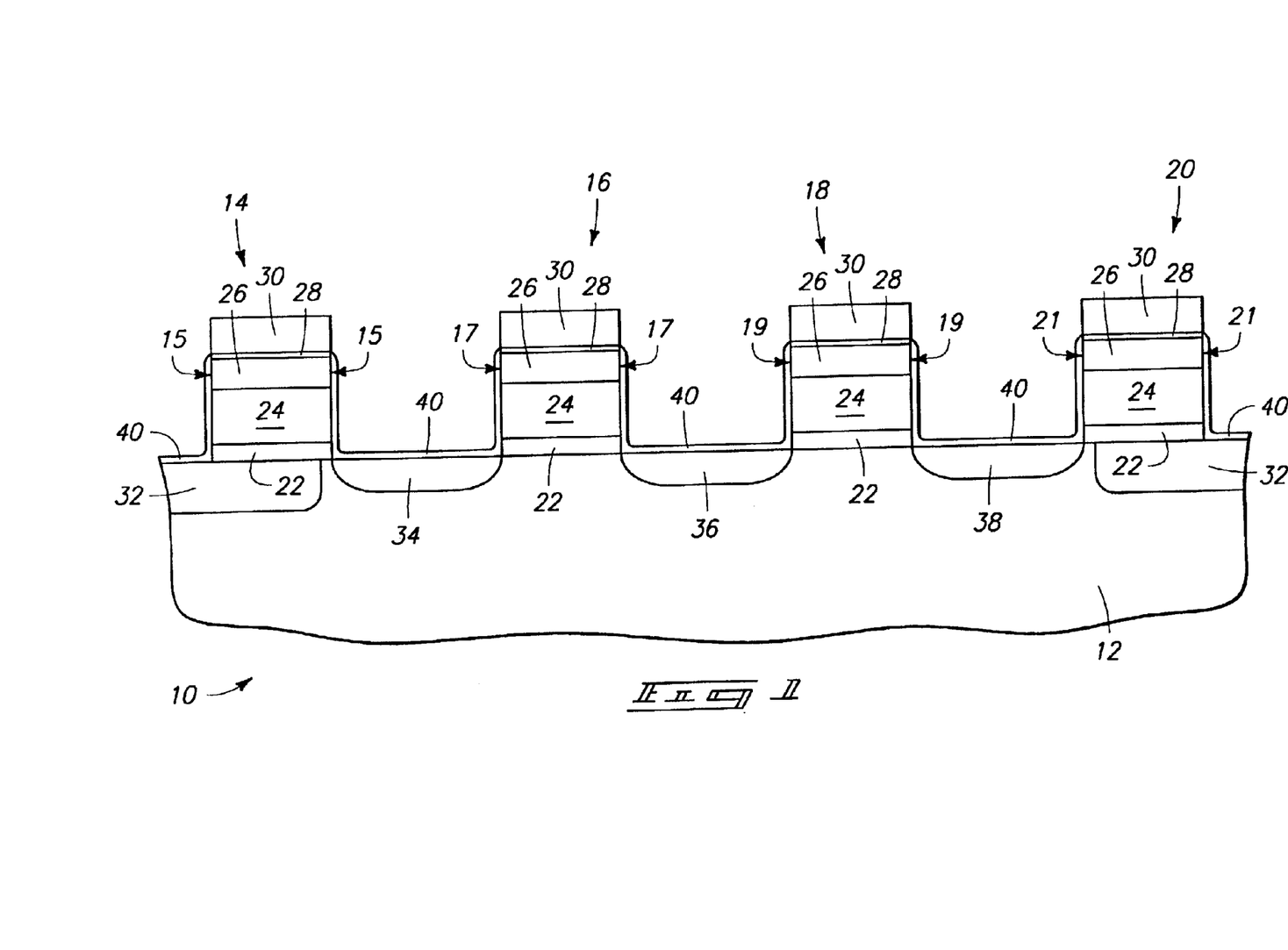
FIG. 1 is a diagrammatic, cross-sectional, fragmentary view of a portion of a semiconductor wafer at an initial processing step of a method of the present invention.

A first embodiment method of the present invention is described with reference to FIGS. 1–5. Referring initially to FIG. 1, a semiconductor wafer fragment 10 comprises a semiconductive material substrate 12 having wordlines 14, 16, 18 and 20 formed thereover. Substrate 12 can comprise, for example, monocrystalline silicon lightly doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Wordlines 14, 16, 18 and 20 comprise a gate oxide layer 22, a polysilicon layer 24, a silicide layer 26, a silicon dioxide layer 28, and an insulative cap 30. Gate oxide layer 22 can comprise, for example, silicon dioxide; semiconductive material layer 24 can comprise, for example, conductively-doped polysilicon; silicide layer 26 can comprise, for example, tungsten silicide or titanium silicide; and insulative cap 30 can comprise, for example, silicon nitride.

Shallow trench isolation regions 32 are formed within substrate 12 and electrically isolate at least some of the shown electrical components of wafer fragment 10 from adjacent circuitry (not shown).

Conductively doped diffusion regions 34, 36 and 38 are formed within substrate 12 and between wordlines 14, 16, 18 and 20. Wordlines 14, 16, 18 and 20 extend into and out of the page (i.e., are in the shape of lines extending across a top of substrate 12), and paired diffusion regions are formed within substrate 12 at spaced intervals along the wordlines. The portions of the wordlines which gatedly connect pairs of diffusion regions constitute transistor gates. Accordingly, the shown portion of wordline 16 constitutes a transistor gate between diffusion regions 34 and 36, and the shown portion of wordline 18 constitutes a transistor gate between diffusion regions 36 and 38.

Diffusion regions 34, 36 and 38 can be doped with one or both of n-type dopant and p-type dopant, and can comprise halo regions and/or lightly doped diffusion (Ldd) regions for transistor structures formed from gates 16 and 18.

Wordlines 14, 16, 18 and 20 comprise sidewalls 15, 17, 19 and 21, respectively, with portions of the sidewalls defined by layers 24 and 26 comprising conductive portions. A silicon dioxide layer 40 is formed along the conductive portions of sidewalls 15, 17, 19 and 21, as well as over diffusion regions 34, 36 and 38. Silicon dioxide layer 40 can be formed by, for example, exposing wafer fragment 10 to oxidizing conditions. Such oxidation can correspond to so-called "smiling gate" oxidation which is known in the art to improve performance of transistor devices. In particular embodiments of the invention which are not shown, layer 40 can be eliminated (e.g., not formed).

Figure 2:
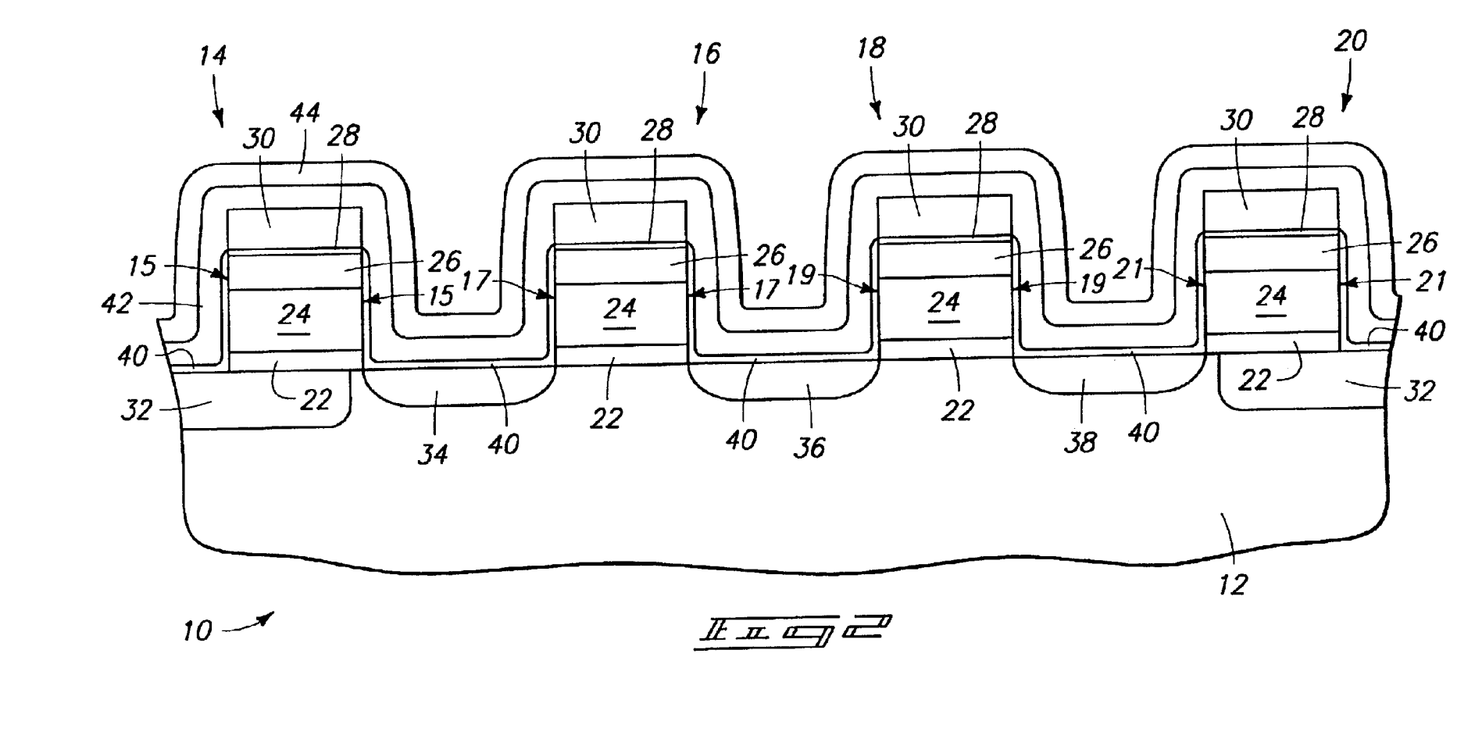
FIG. 2 is a view of the FIG. 1 wafer fragment shown at a processing step subsequent to that of FIG. 1.

Referring to FIG. 2, a pair of layers 42 and 44 are formed over wordlines 14, 16, 18 and 20, as well as over regions of substrate 12 between wordline 14, 16, 18 and 20. Layers 42 and 44 comprise electrically insulative material, and at least one of layers 42 and 44 comprises at least one of $Si_xO_yN_z$ (silicon oxynitride) and $Al_pO_q$, with p, q, x, y and z being greater than 0 and less than 10. Layers 42 and 44 can further comprise other insulative materials such as, for example, silicon nitride (which typically is $Si_3N_4$). Each of layers 42 and 44 can have a thickness of, for example, from about 10Å to about 750 Å, with a suitable thickness being about 150 Å. In embodiments in which layer 40 is not formed (not shown), layer 42 will physically contact (i.e., be against) the conductive material of wordlines 14, 16, 18 and 20.

In particular embodiments, one of layers 42 and 44 can consist of either $Si_xO_yN_z$ or $Al_pO_q$ (or consist essentially of such materials), and the other of layers 42 and 44 can consist of silicon and nitrogen (or consist essentially of silicon and nitrogen), and can be, for example, $Si_3N_4$. Alternatively, one of layers 42 and 44 can consist of aluminum and oxygen (or consist essentially of such materials), and the other of layers 42 and 44 can consist of silicon and nitrogen (or consist essentially of such materials). In yet another alternative embodiment, one of layers 42 and 44 can consist of silion, nitrogen and oxygen (or consist essentially of such materials), and the other of layers 42 and 44 can consist of silicon and nitrogen (or consist essentially of such materials). An exemplary material which consists of aluminum and oxygen $Al_2O_3$.

Figure 3:
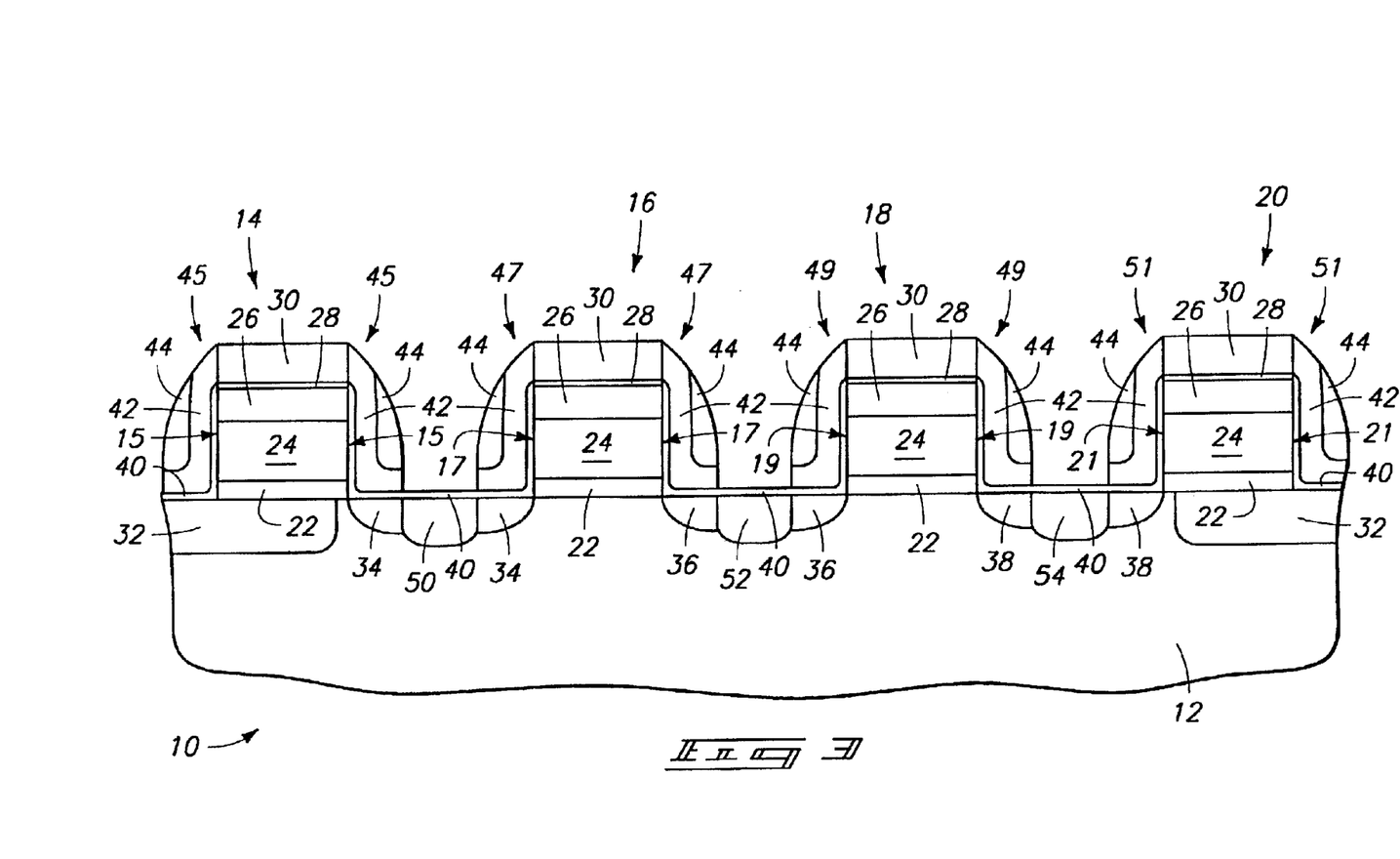
FIG. 3 is a view of the FIG. 1 wafer fragment shown at a processing step subsequent to that of FIG. 2.

Referring to FIG. 3, layers 42 and 44 are anisotropically etched to form electrically insulative pillars 45, 47, 49 and 51 along sidewalls 15, 17, 19 and 21, respectively. A suitable anisotropic etch of materials 42 and 44 can comprise, for example, a plasma etch utilizing one or more of $CF_4$, $CHF_3$ and $O_2$. The anisotropic etch of layers 42 and 44 removes such layers from over wordlines 14, 16, 18 and 20.

Although in the shown embodiment pillars 45, 47, 49 and 51 are spaced from conductive portions of sidewalls 15, 17, 19 and 21 by silicon oxide layer 40, it is to be understood that the invention encompasses other embodiments (not shown) wherein oxide material 40 is not formed, and accordingly wherein pillars 45, 47, 49 and 51 are formed against the a conductive portions of sidewalls 15, 17, 19 and 21. Also, although in the shown embodiment the anisotropic etching of materials 42 and 44 is selective relative to the silicon oxide material 40 such that oxide material 40 is not etched by the anisotropic etching conditions, it is to be understood that the invention encompasses other embodiments (not shown) wherein oxide material 40 is removed by the anisotropic etching conditions. Additionally, the invention encompasses embodiments in which oxide material 40 is removed in an etch subsequent to the anisotropic etch of materials 42 and 44.

Heavily doped source/drain regions 50, 52 and 54 are implanted proximate gates 16 and 18, utilizing pillars 45, 47, 49 and 51 as spacers to align the implants. Regions 50, 52 and 54 are referred to as "heavily doped" regions because they are more heavily doped than regions 34, 36 and 38. A typical peak dopant concentration in regions 50, 52 and 54 is greater than $10^{19}$ atoms/cm$^3$. The implanted dopant utilized to form heavily doped source/drain regions 50, 52 and 54 can be either p-type dopant or n-type dopant, depending on whether PMOS or NMOS transistors are formed. It is noted that materials 42 and 44 do not extend over heavily-doped source/drain regions 50, 52 and 54.

Although source/drain regions 50, 52 and 54 are shown implanted through silicon oxide layer 40, it is to be understood that the invention encompasses other embodiments (not shown) wherein silicon oxide layer 40 is removed prior to the implant of regions 50, 52 and 54.

Figure 4:
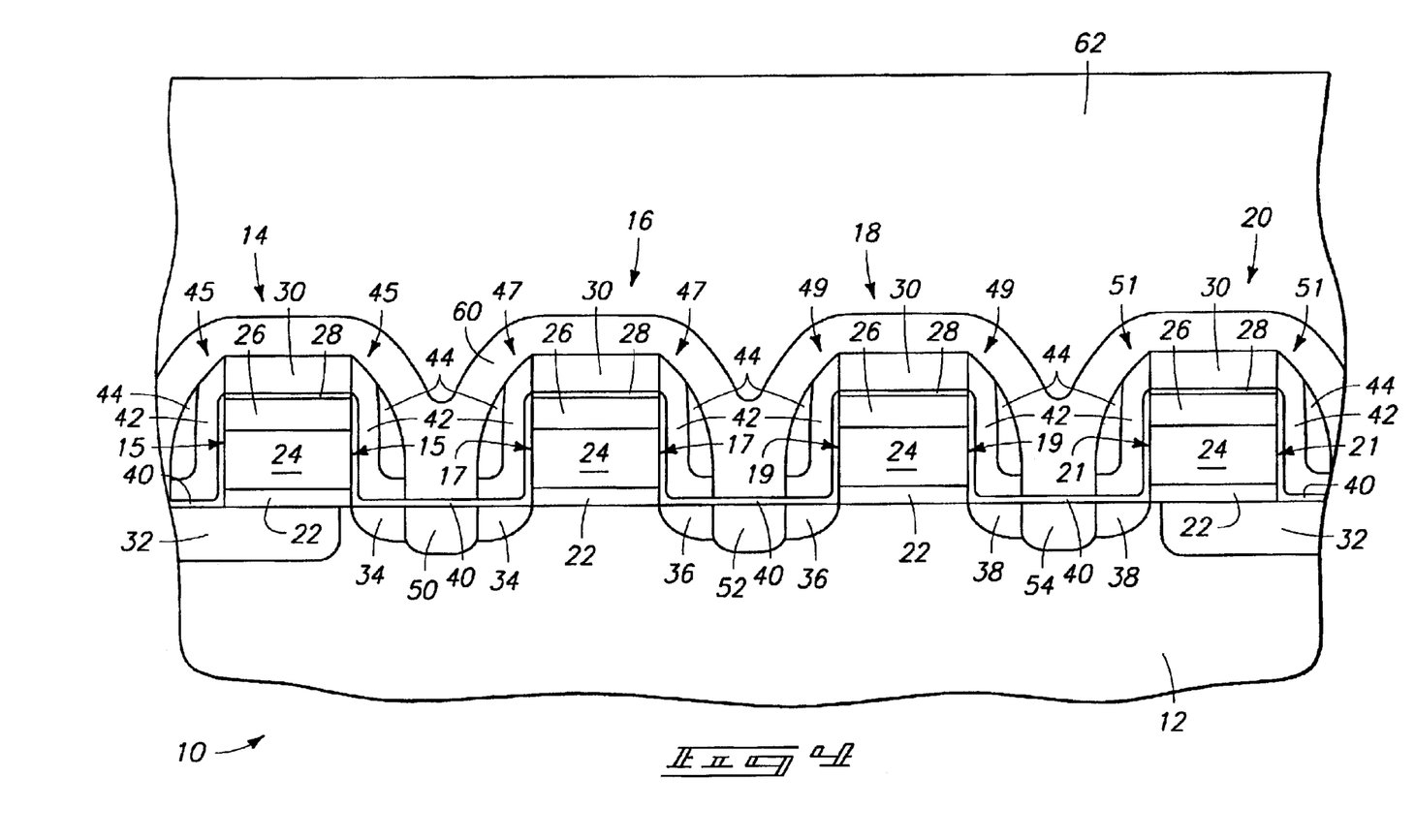
FIG. 4 is a view of the FIG. 1 wafer fragment shown at a processing step subsequent to that of FIG. 3.

Referring to FIG. 4, a dopant barrier layer 60 is formed over pillars 45, 47, 49 and 51, as well as over wordlines 14, 16, 18 and 20. Dopant barrier layer 60 can consist of silicon dioxide (or consist essentially of silicon dioxide), and can be formed by chemical vapor deposition utilizing tetraethyl orthosilicate (TEOS) as a precursor. Layer 60 can comprise a thickness of, for example, about 250 Å.

A doped oxide layer 62 is formed over dopant barrier layer 60, and can comprise, for example, BPSG. Dopant barrier layer 60 prevents dopant migration from doped oxide 62 into the $Si_xO_yN_z$ or $Al_pO_q$ materials of pillars 45, 47, 49 and 51. Barrier layer 60 thus alleviates problems associated with dopant migrating into such materials and changing the properties of such materials from electrically insulative to electrically conductive.

Figure 5:
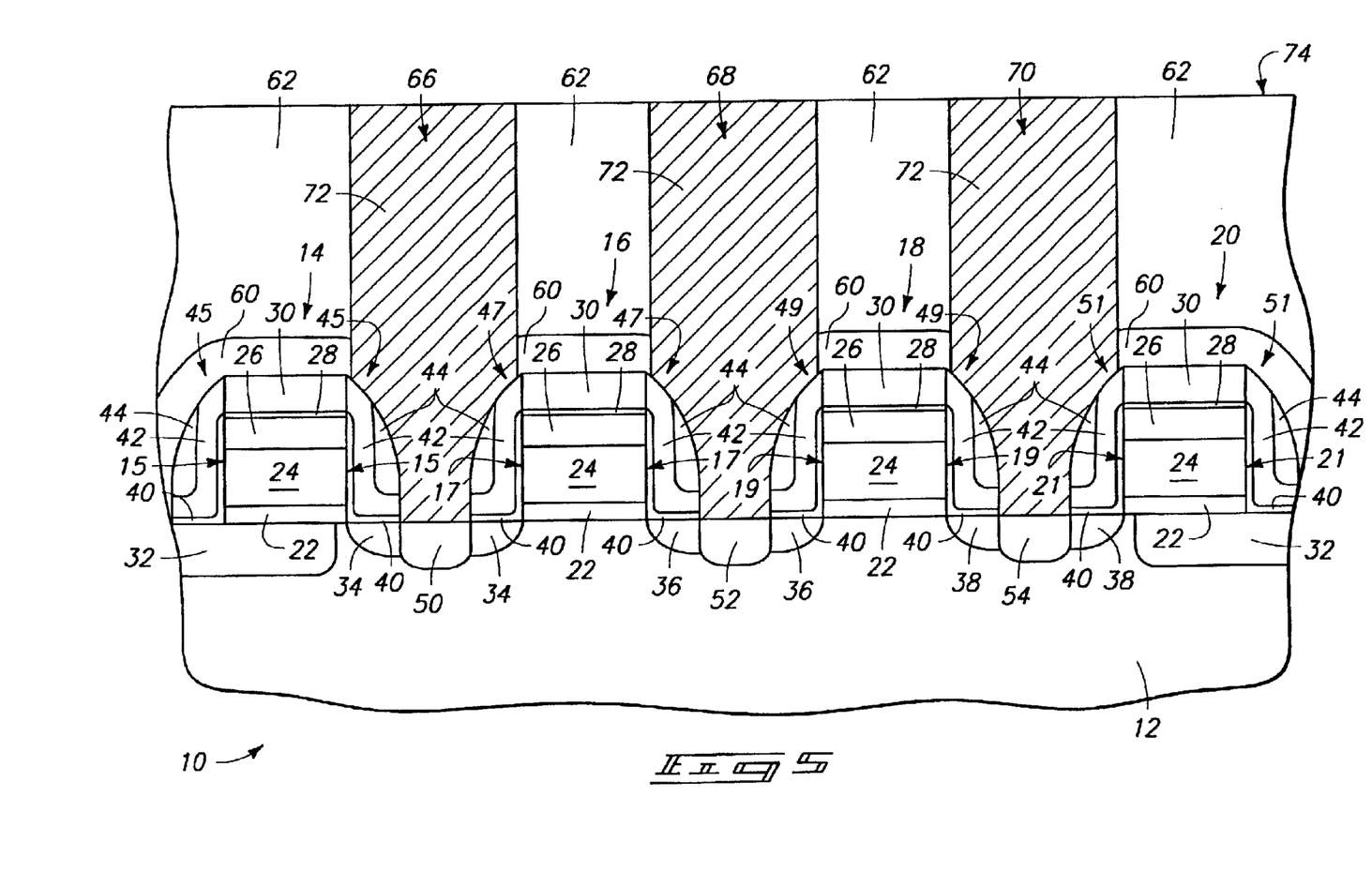
FIG. 5 is a view of the FIG. 1 wafer fragment shown at a processing step subsequent to that of FIG. 4.

Referring to FIG. 5, contact openings 66, 68 and 70 are etched through layers 60 and 62 to expose upper surfaces of source/drain regions 50, 52 and 54. Openings 66, 68 and 70 can be formed by photolithographic processing (i.e., by providing a patterned layer of photoresist over an upper surface of doped oxide 62, and subsequent etching through oxides 40, 60 and 62), or other techniques. Pillars 45, 47, 49 and 51 are utilized to align bottom portions of openings 66, 68 and 70 relative to source/drain regions 50, 52 and 54, and accordingly the formation of openings 66, 68 and 70 constitutes a SAC etch. The $Si_xO_yN_z$ and/or $Al_pO_q$ of pillars 45, 47, 49 and 51 reduces etching of the pillars relative to that which would occur if the pillars were formed entirely of $Si_3N_4$. However, as discussed above with reference to FIG. 2, one of layers 42 and 44 can consist essentially of silicon nitride. It can be advantageous to have the innermost of the layers (i.e., layer 42) consist of either $Si_xO_yN_z$ or $Al_pO_q$ and the outermost of the layers (i.e., layer 44) consist of silicon nitride, so that if there is some over-etching occurring during the anisotropic etching described with reference to FIG. 3, it will be silicon nitride layer 44 which is removed, rather than the layer of $Si_xO_yN_z$ or $Al_pO_q$.

Conductive material 72 is formed within openings 66, 68 and 70 to form electrical contacts to source/drain regions 50, 52 and 54. Conductive material 72 can comprise conductively-doped polysilicon, and/or metal, and can comprise multiple materials, such as, for example, a silicide at a lower portion where it joins the source/drain region and either metal nitride or metal above the silicide. In the shown embodiment, wafer fragment 10 comprises a planarized upper surface 74 which can be formed by, for example, chemical-mechanical planarization after filling openings 66, 68 and 70 with conductive material 72.

Another embodiment of the invention is described with reference to FIGS. 6–9. In referring to FIGS. 6–9, similar numbering will be utilized as was used above in describing FIGS. 1–5, where appropriate.

Figure 6:
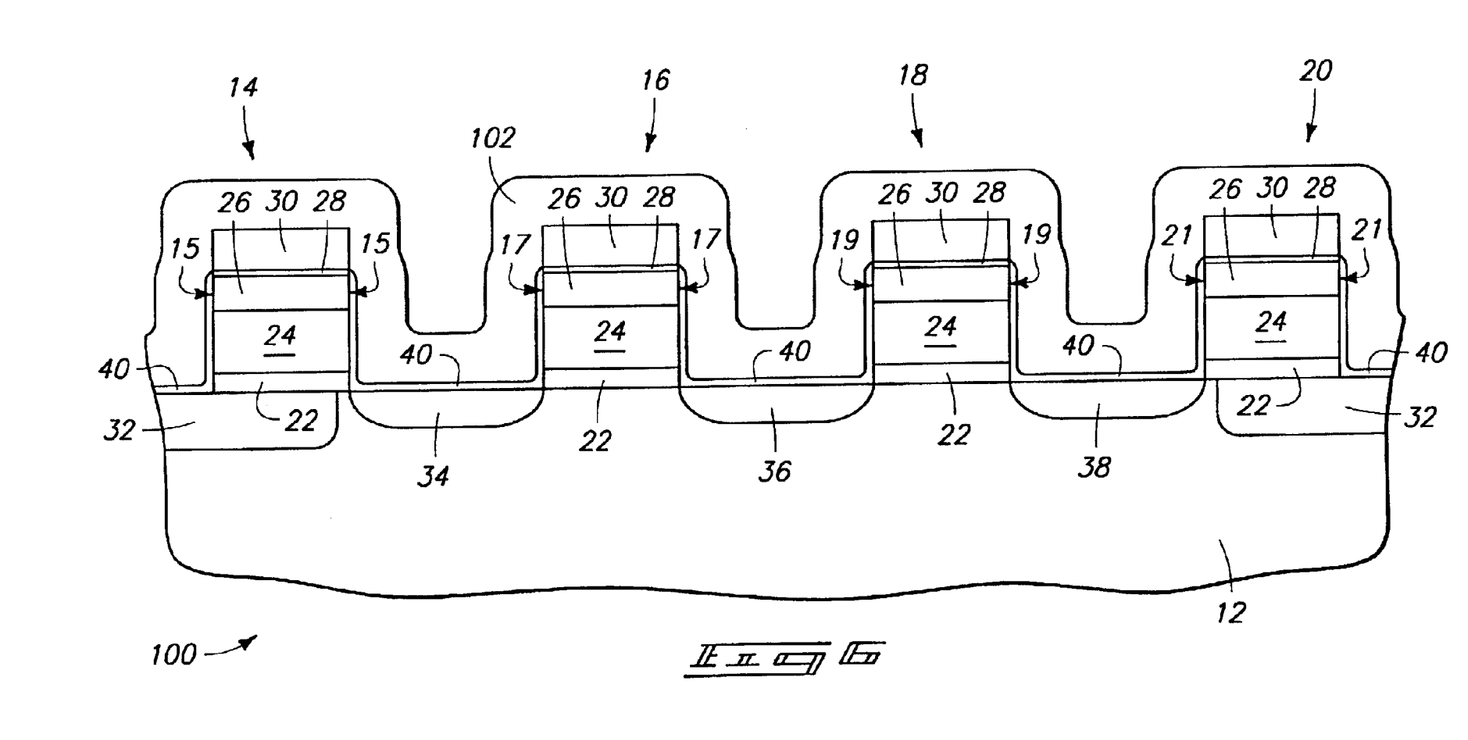
FIG. 6 is a view of the FIG. 1 wafer fragment shown at a processing step subsequent to that of FIG. 1 in accordance with a second embodiment of the present invention.

Referring first to FIG. 6, a wafer fragment 100 comprises a substrate 12 having wordlines 14, 16, 18 and 20 formed thereover. An insulative material 102 is provided over wordlines 14, 16, 18 and 20, as well as over regions of substrate 12 between wordlines 14, 16, 18 and 20. Material 102 consists of, or consists essentially of, $Si_xO_yN_z$ or $Al_pO_q$, with p, q, x, y and z being greater than 0 and less than 10, and can be provided to a thickness of, for example, from about 10 Å to about 750 Å, with a suitable thickness being greater than about 50 Å, and being, for example, about 25% of the gate length for the particular structure. In embodiments in which layer 40 is not formed (not shown), material 102 will contact conductive material of gates 14, 16, 18 and 20.

Figure 7:
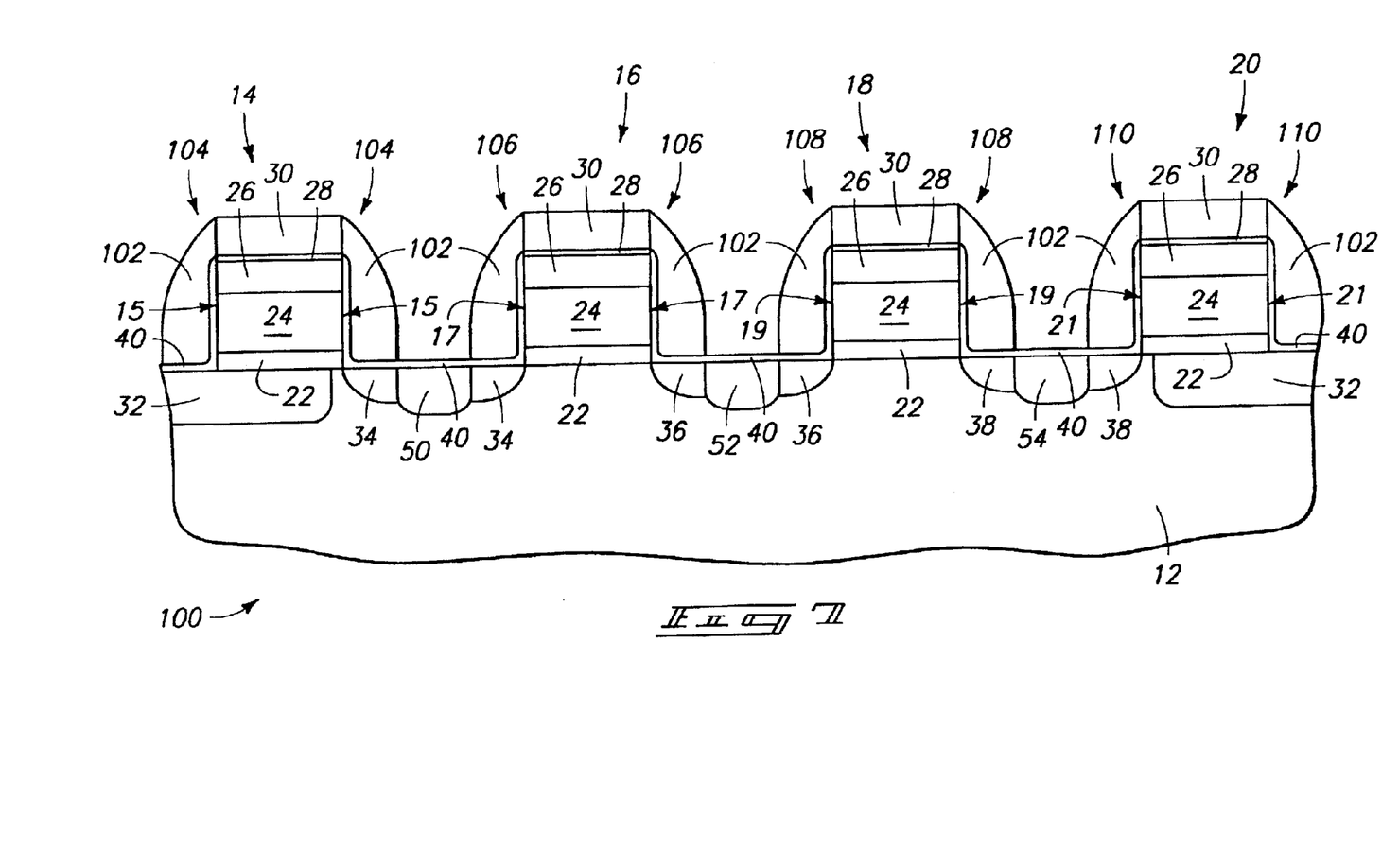
FIG. 7 is a view of the FIG. 6 wafer fragment shown at a processing step subsequent to that of FIG. 6.

Referring to FIG. 7, material 102 is anisotropically etched to form insulative pillars 104, 106, 108 and 110 adjacent wordlines 14, 16, 18 and 20, respectively. Subsequently, source/drain regions 50, 52 and 54 are implanted into substrate 12.

Figure 8:
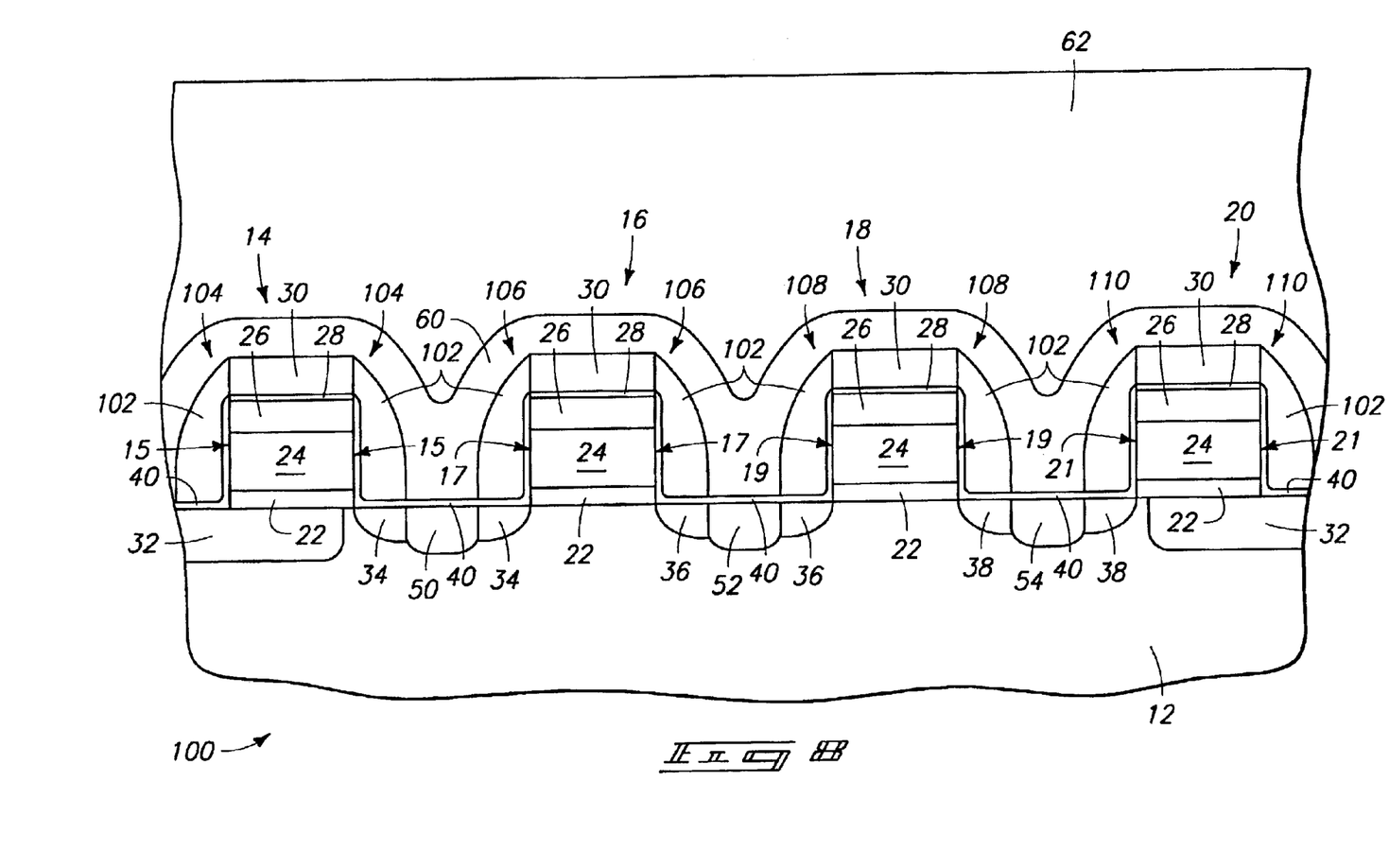
FIG. 8 is a view of the FIG. 6 wafer fragment shown at a processing step subsequent to that of FIG. 7.

Referring to FIG. 8, a dopant barrier layer 60 and doped oxide layer 62 are provided over wordlines 14, 16, 18 and 20 as well as over pillars 104, 106, 108 and 110.

Figure 9:
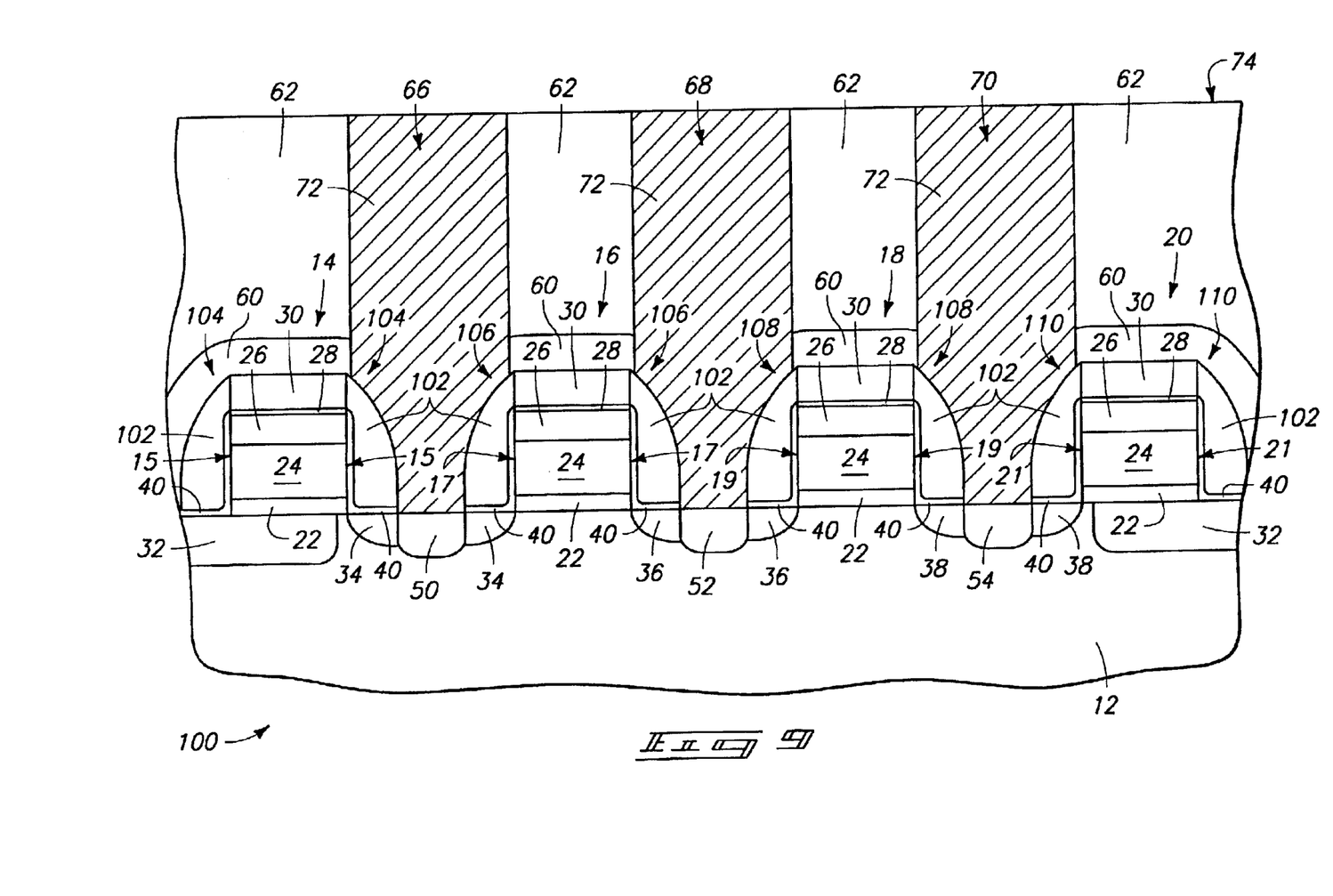
FIG. 9 is a view of the FIG. 6 wafer fragment shown at a processing step subsequent to that of FIG. 8.

Referring to FIG. 9, openings 66, 68 and 70 are formed through materials 40, 60 and 62 to source/drain regions 50, 52 and 54, and such openings are filled with conductive material 72. The formation of openings 66, 68 and 70 can be accomplished by the processing described above with reference to FIG. 5, and accordingly can constitute a SAC etch. Pillars 104, 106, 108 and 110 protect conductive material of wordlines 14, 16, 18 and 20 from being etched during the formation of openings 66, 68 and 70. Further, protective layer 60 (which, as described above, can consist of silicon dioxide and be chemical vapor deposited utilizing TEOS as a precursor), prevents dopant migration from doped oxide 62 into the material of pillars 104, 106, 108 and 110.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a transistor structure, comprising:

forming a transistor gate over a substrate, the transistor gate comprising a sidewall which comprises electrically conductive material;

forming an electrically insulative material along the electrically conductive material of the transistor gate sidewall; the electrically insulative material comprising at least two separate layers; a first of the at least two layers comprising $Al_pO_q$, wherein p and q are greater than 0 and less than 10; a second of the at least two layers consisting essentially of silicon and nitrogen, the first of the at least two layers being disposed between the transistor gate sidewall and the second of the at least two layers;

anisotropically etching the electrically insulative material to form a spacer along the transistor gate sidewall; the anisotropically etching comprising etching both of the first and second of the at least two layers;

depositing a dopant barrier layer over the spacer;

forming a doped oxide layer over the barrier layer; and etching a contact opening through the doped oxide and through the barrier layer adjacent the spacer utilizing the spacer to align the contact opening, the etching exposing at least a portion of the spacer.

2. The method of claim 1 further comprising implanting a dopant into the substrate and utilizing the spacer to align the dopant during the implant.

3. The method of claim 1 wherein the first of the at least two layers consists essentially of $Al_pO_q$.

4. The method of claim 1 wherein the first of the at least two layers consists of $Al_pO_q$.

5. The method of claim 1 wherein the first of the at least two layers consists of $Al_2O_3$.

6. The method of claim 1 wherein the dopant barrier layer comprises silicon dioxide.

7. The method of claim 1 wherein the doped oxide layer comprises BPSG.

8. The method of claim 1 further comprising depositing a conductive material within the contact opening, a portion of the conductive material being in contact with the first of the at least two layers comprised by the sidewall.

* * * * *